(12) United States Patent
Tsai

(10) Patent No.: US 8,403,136 B1
(45) Date of Patent: Mar. 26, 2013

(54) WATERPROOF, SHOCKPROOF CONTAINER FOR HANDHELD ELECTRONIC DEVICE

(75) Inventor: Kuo Sung Tsai, New Taipei (TW)

(73) Assignee: AAEON Technology Inc., New Taipei (TW)

( * ) Notice: Subject to any disclaimer, the term of this patent is extended or adjusted under 35 U.S.C. 154(b) by 0 days.

(21) Appl. No.: 13/447,313

(22) Filed: Apr. 16, 2012

(51) Int. Cl.
*H05K 5/02* (2006.01)

(52) U.S. Cl. ............. 206/320; 455/575.8; 361/679.3; 361/679.56; 220/4.01

(58) Field of Classification Search ............ 220/4.01; 206/320; 361/679.3, 679.56; 379/440, 433.11; 455/575.8; D3/269, 218; D14/250
See application file for complete search history.

(56) References Cited

U.S. PATENT DOCUMENTS

| | | | | |
|---|---|---|---|---|
| 5,479,285 A * | 12/1995 | Burke | | 349/58 |
| 5,648,757 A * | 7/1997 | Vernace et al. | | 340/539.32 |
| 6,659,274 B2 * | 12/2003 | Enners | | 206/305 |
| 7,158,376 B2 * | 1/2007 | Richardson et al. | | 361/679.56 |
| 7,447,532 B2 * | 11/2008 | Hsu | | 455/575.8 |
| 7,464,814 B2 * | 12/2008 | Carnevali | | 206/320 |
| 7,733,642 B2 * | 6/2010 | Liou et al. | | 361/679.41 |
| D623,651 S * | 9/2010 | Hsu | | D14/439 |
| 7,938,260 B2 * | 5/2011 | Lin | | 206/320 |
| 7,941,196 B2 * | 5/2011 | Kawasaki et al. | | 455/575.8 |
| D646,673 S * | 10/2011 | Fathollahi | | D14/250 |
| 8,032,194 B2 * | 10/2011 | Liu et al. | | 455/575.8 |
| 8,033,418 B2 * | 10/2011 | Estlander | | 220/678 |
| 2010/0224519 A1 * | 9/2010 | Kao | | 206/320 |
| 2010/0264786 A1 * | 10/2010 | Cheng | | 312/223.1 |
| 2011/0024315 A1 * | 2/2011 | Kim | | 206/320 |
| 2011/0192743 A1 * | 8/2011 | May et al. | | 206/320 |

* cited by examiner

*Primary Examiner* — J. Gregory Pickett
*Assistant Examiner* — Mollie Llewellyn

(57) ABSTRACT

A waterproof, shockproof container for a handheld electronic device is provided with a rectangular base including a top loop flange disposed along and spaced from edges, a loop gap between the flange and the edges of the base, four bottom L-shaped depressions at four corners of the base respectively, and threaded holes spaced along the gap wherein four of the threaded holes are through the depressions respectively; a rectangular waterproof loop member fitted in the loop gap and including bossed holes spaced along edges, and four L-shaped collision resistant members at four corners of the waterproof loop member respectively; a rectangular, hollow frame including a loop flange disposed along edges, and bossed threaded holes spaced along an inner surface of the flange; and a rectangular, hollow bumper member. The base, the frame, and the bumper member are releasably secured together.

1 Claim, 14 Drawing Sheets

WATERPROOF, SHOCKPROOF CONTAINER FOR HANDHELD ELECTRONIC DEVICE

BACKGROUND OF THE INVENTION

1. Field of the Invention

The invention relates to containers and more particularly to a waterproof, shockproof container for a handheld electronic device (e.g., tablet computer).

2. Description of Related Art

The need for completely waterproof, shockproof container for handheld electronic devices (e.g., tablet computers) increases due to its wide spread use. In the past, handheld electronic devices have been used with various degrees of dust proofing and splash proofing. The earlier designs were primarily for protection against corrosion of the electrical terminals which could cause failure in a somewhat long term. However, this is not sufficient.

Moreover, since the engagement interface between two joined components is generally a plane, the water is able to permeate the inside of the handheld electronic device through interstices between the joined components.

Therefore, it is desirable and necessary to design a completely waterproof, shockproof container for a handheld electronic device for preventing water from flowing into the handheld electronic device.

SUMMARY OF THE INVENTION

It is therefore one object of the invention to provide a container comprising a rectangular base comprising a loop flange on a top, the loop flange being disposed along and spaced from edges, a loop gap formed between the flange and the edges of the base, four L-shaped depressions on a bottom at four corners of the base respectively, and a plurality of threaded holes spaced along the loop gap wherein four of the threaded holes are through the depressions respectively; a rectangular waterproof loop member comprising a plurality of bossed holes spaced along edges, and four L-shaped collision resistant members at four corners of the waterproof loop member respectively; a rectangular, hollow frame comprising a loop flange disposed along edges, and a plurality of bossed threaded holes spaced along an inner surface of the flange; and a rectangular, hollow bumper member; wherein the collision resistant members are complimentary to the depressions; wherein the waterproof loop member is fitted in the loop gap; and wherein the base, the frame, and the bumper member are releasably secured together with the threaded holes, the bossed holes, and the bossed threaded holes being aligned with one another.

The above and other objects, features and advantages of the invention will become apparent from the following detailed description taken with the accompanying drawings.

DETAILED DESCRIPTION OF THE INVENTION

Figure 1:
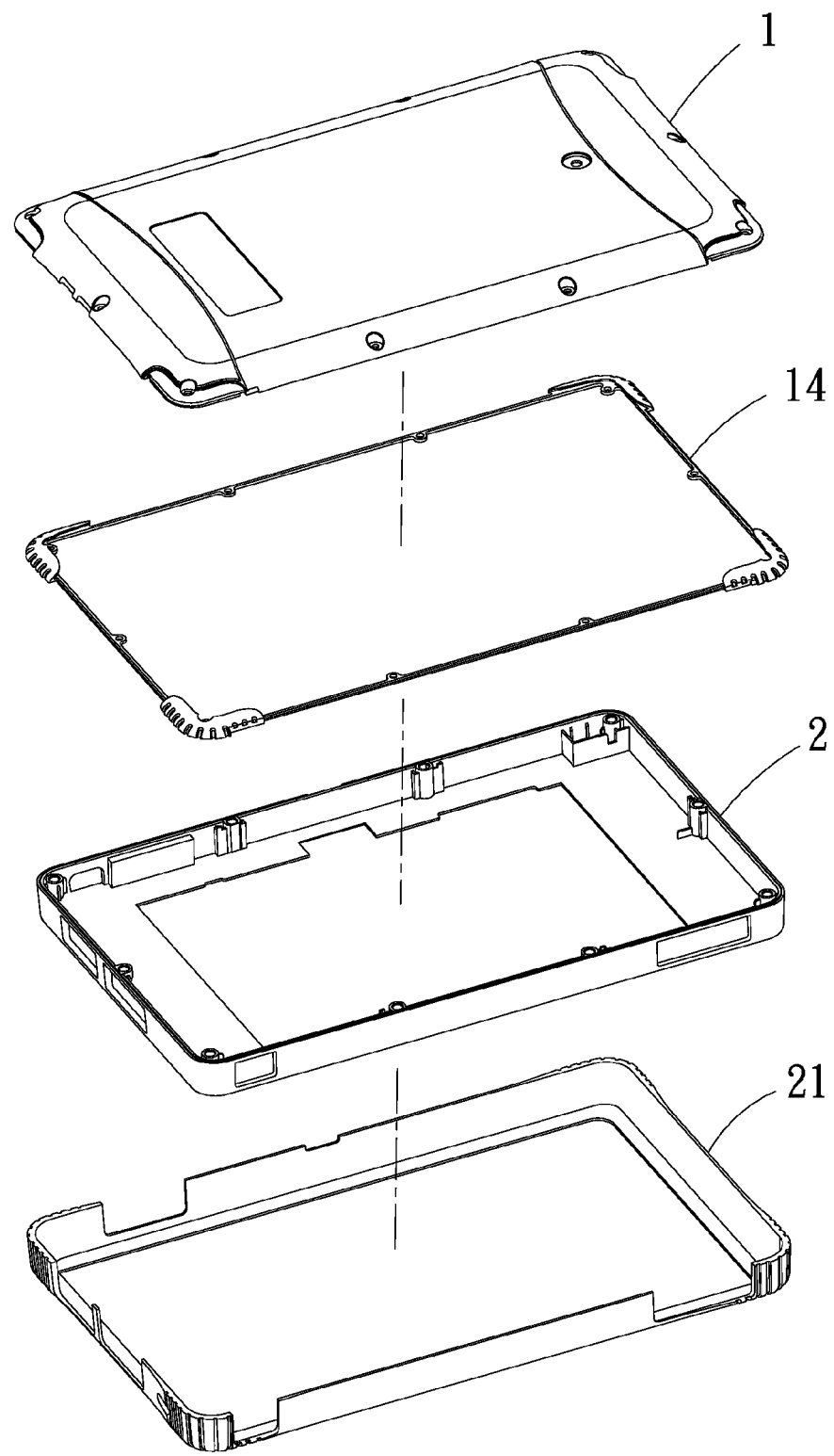
FIG. 1 is a perspective view of a waterproof, shockproof container for handheld electronic device according to the invention.
Figure 2:
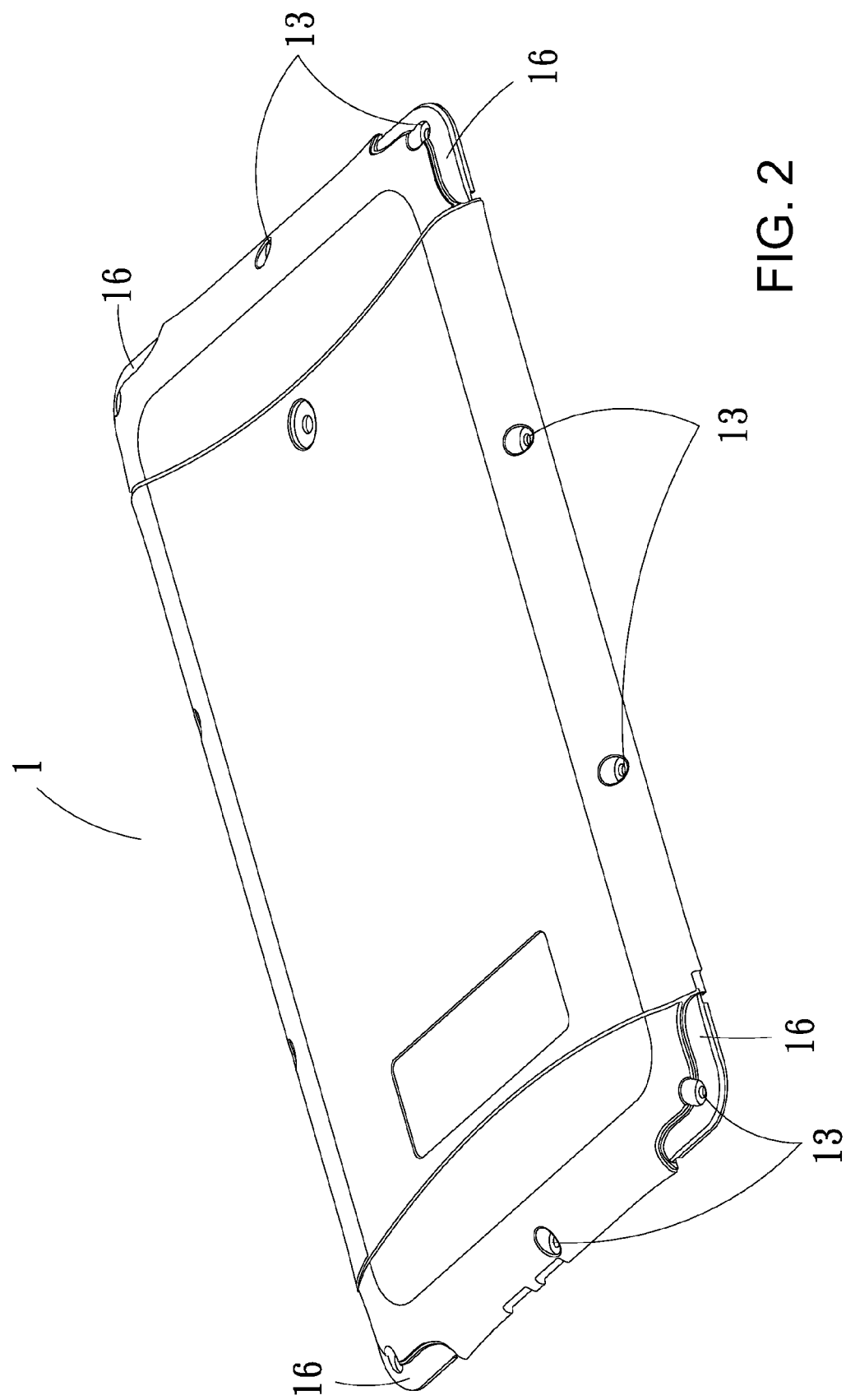
FIG. 2 is a perspective view of the base viewing from below.
Figure 3:
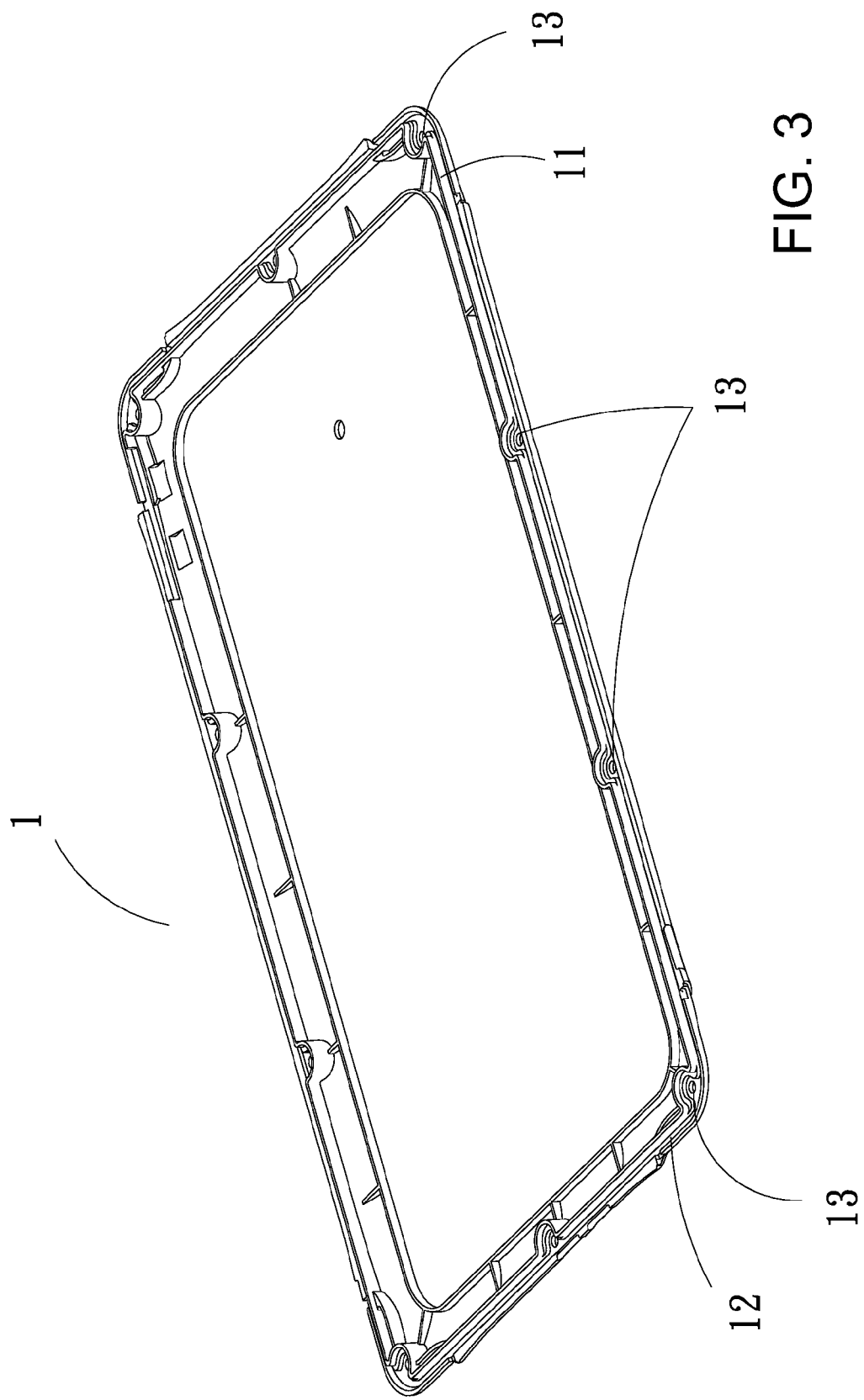
FIG. 3 is a perspective view of the base viewing from above.
Figure 4:
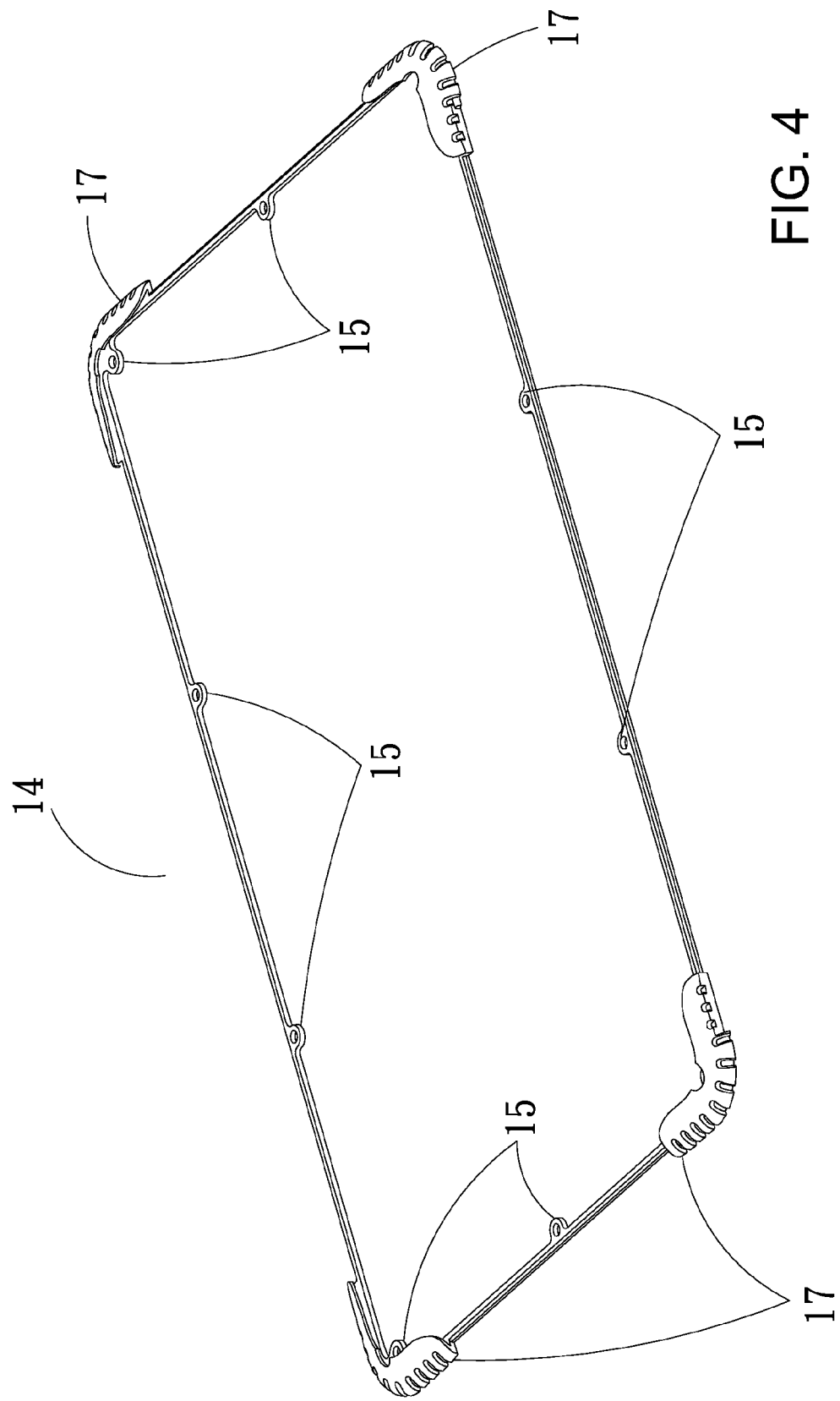
FIG. 4 is a perspective view of the waterproof loop member.
Figure 5:
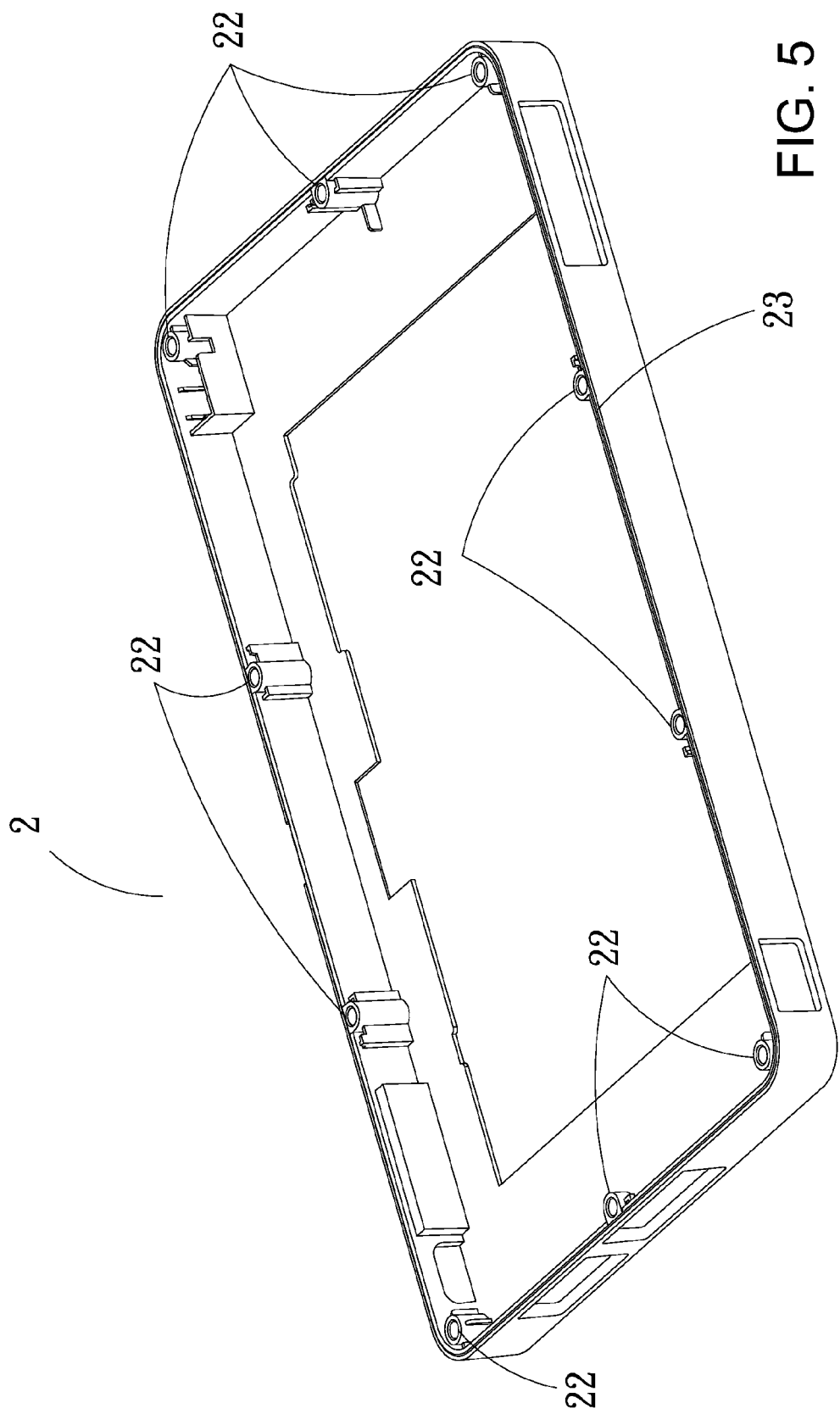
FIG. 5 is a perspective view of the frame.
Figure 6:
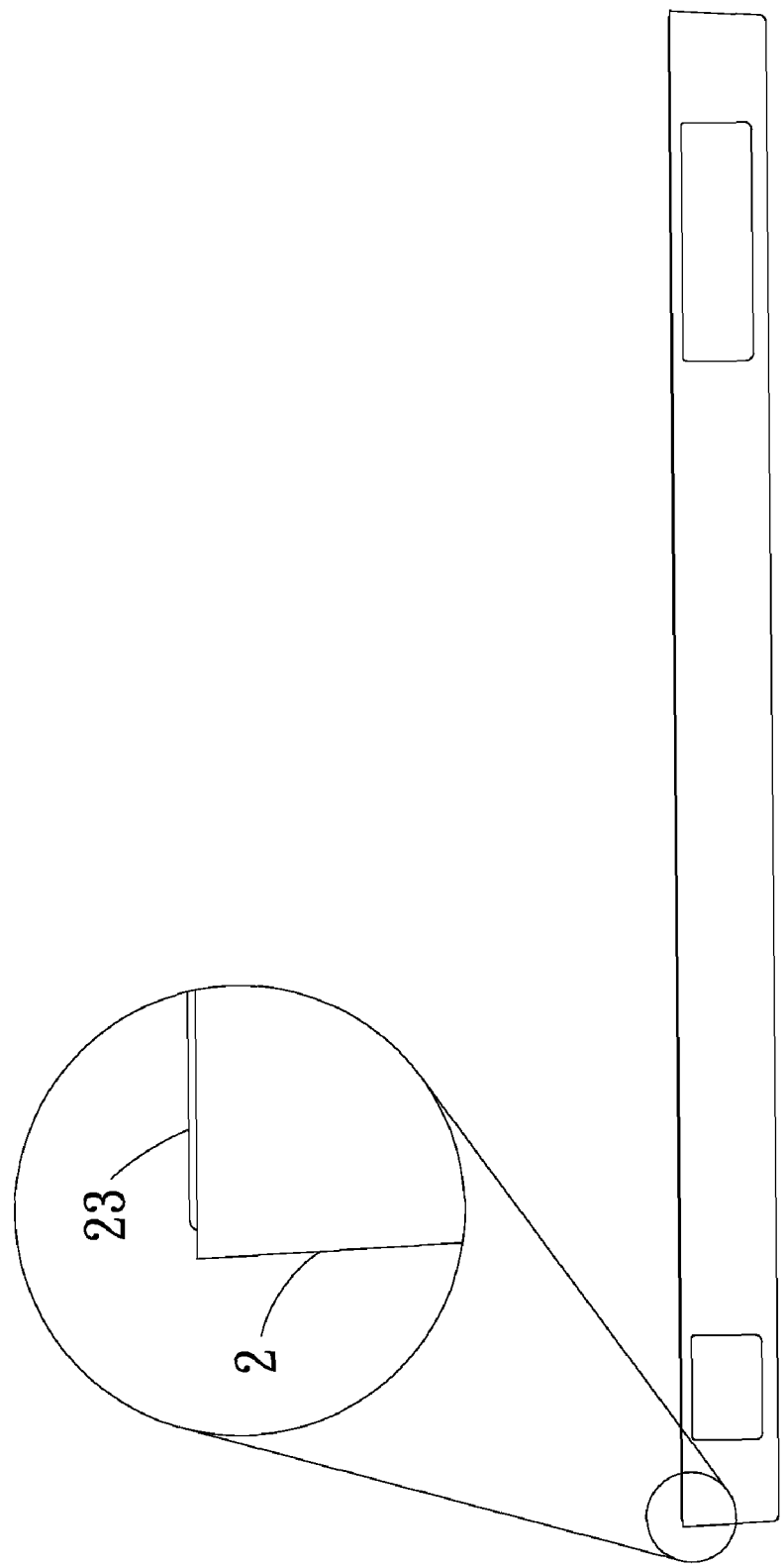
FIG. 6 is a side elevation of the frame.
Figure 7:
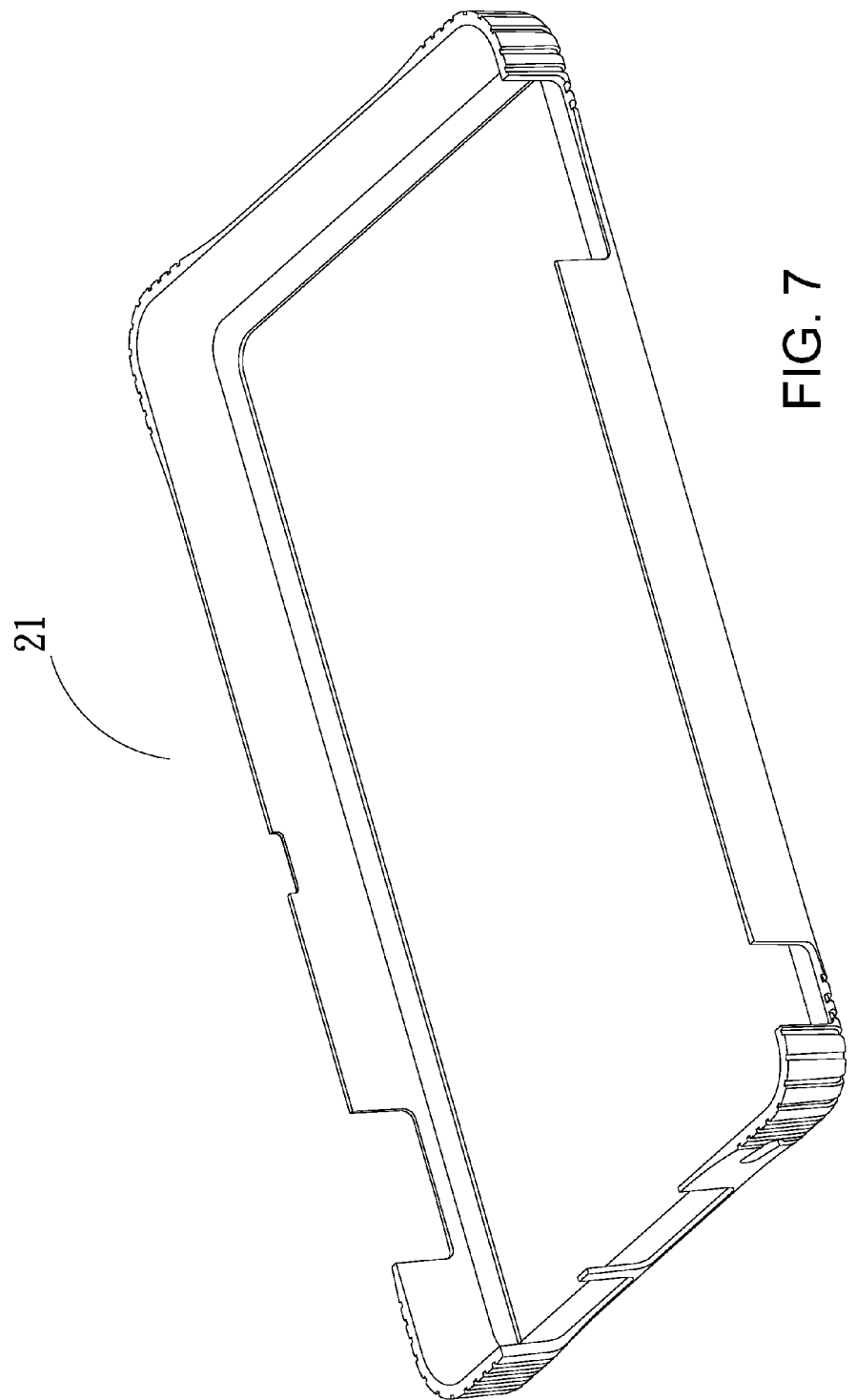
FIG. 7 is a perspective view of the bumper member.
Figure 8:
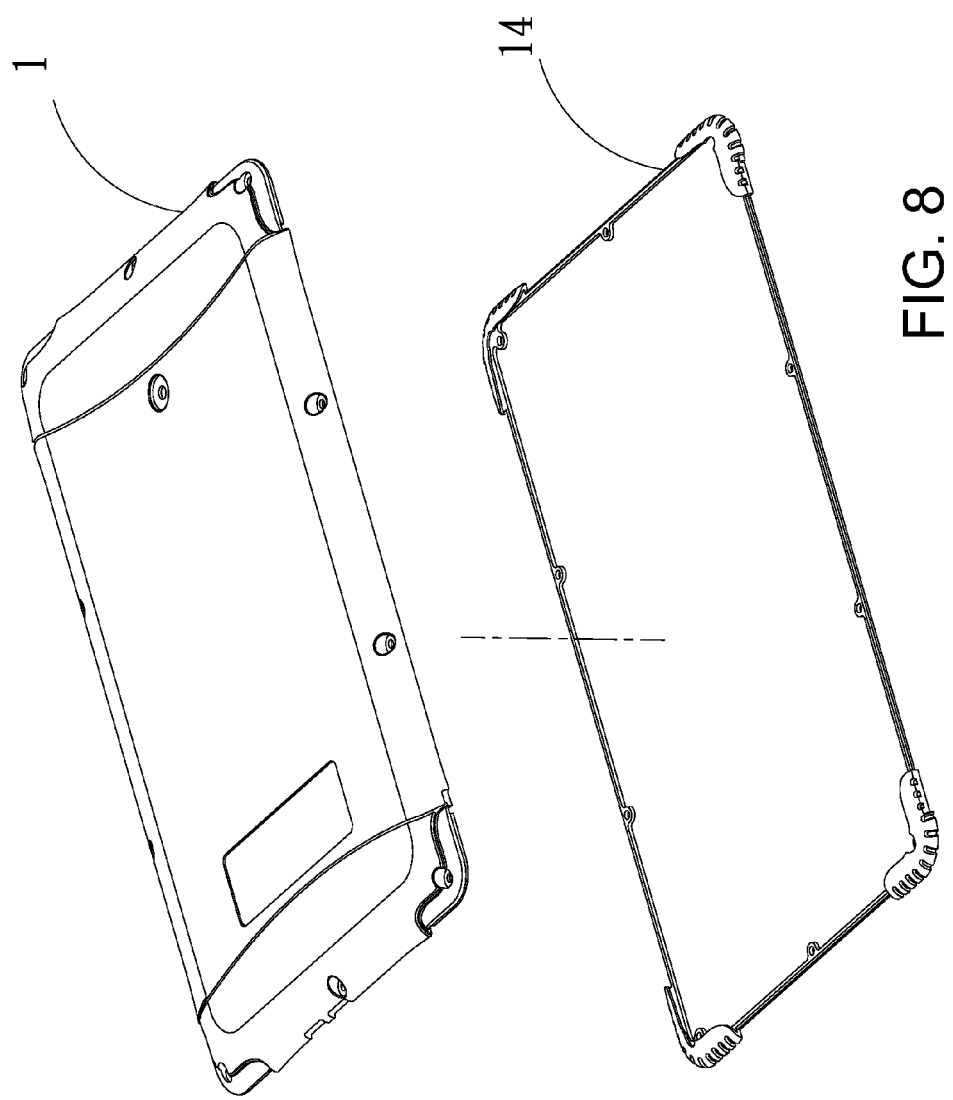
FIG. 8 is an exploded view of the base and the waterproof loop member to be joined together.
Figure 9:
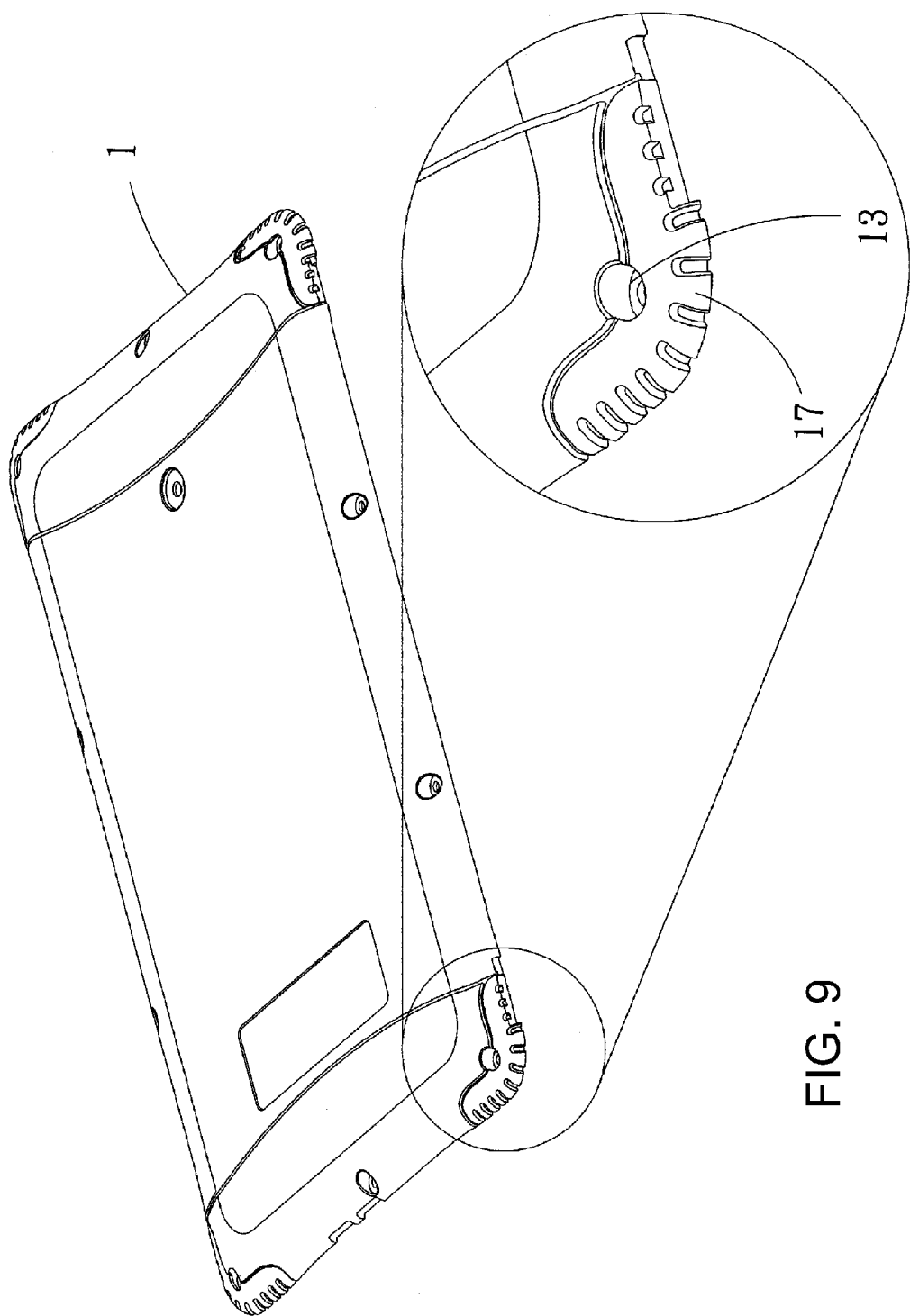
FIG. 9 is a perspective view of the assembled base and the waterproof loop member viewing from below.
Figure 10:
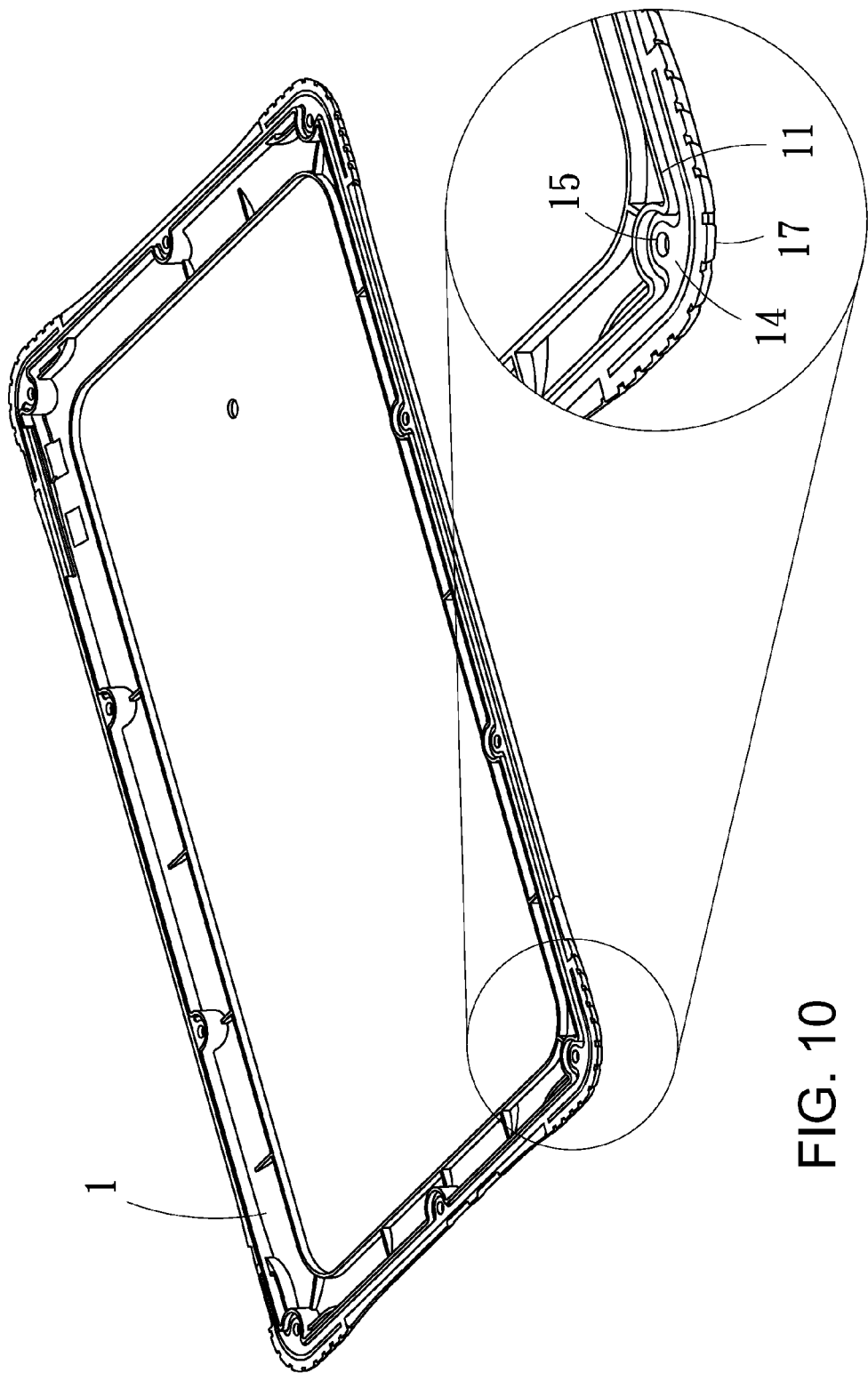
FIG. 10 is a perspective view of the assembled base and the waterproof loop member viewing from above.
Figure 11:
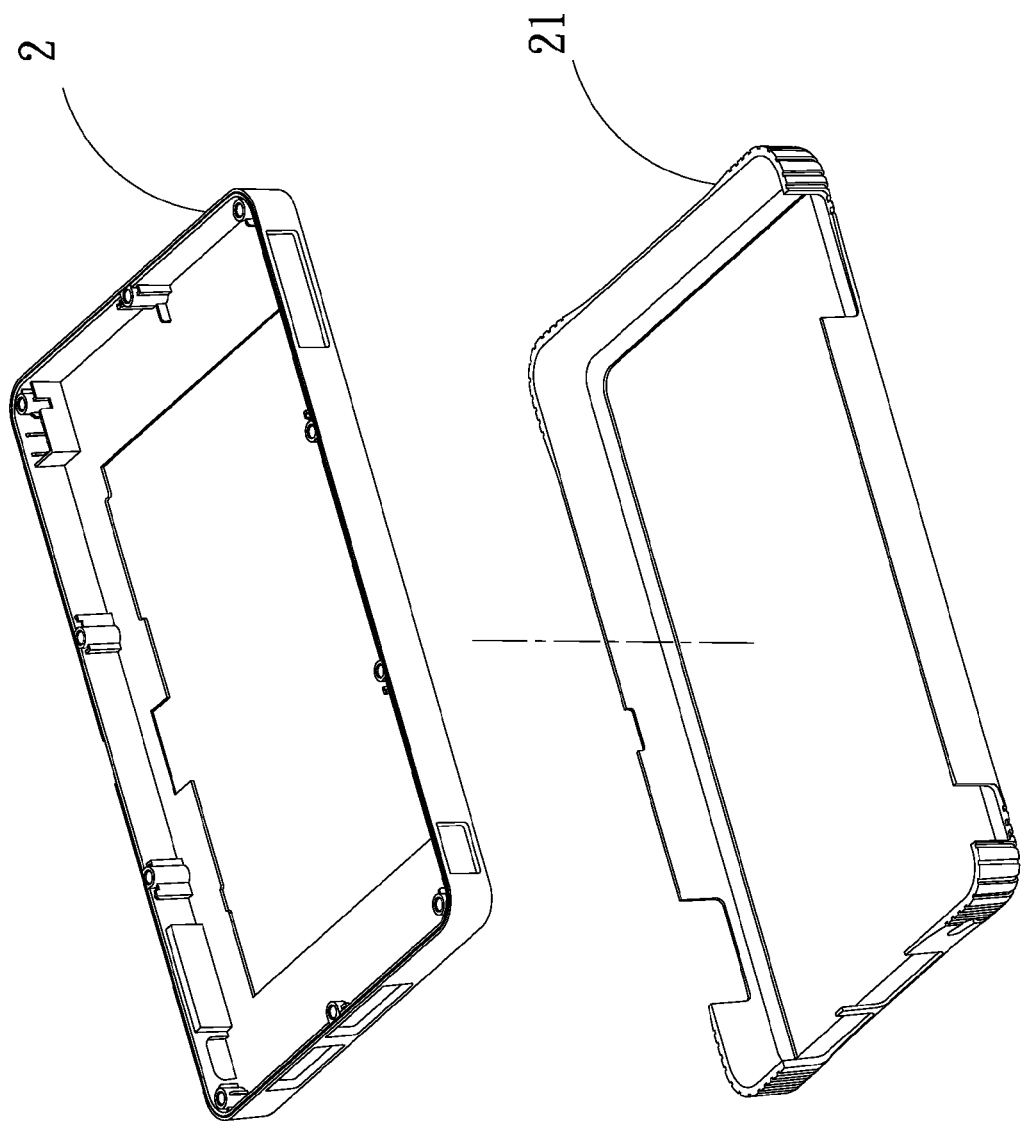
FIG. 11 is an exploded view of the frame and the bumper member to be joined together.
Figure 12:
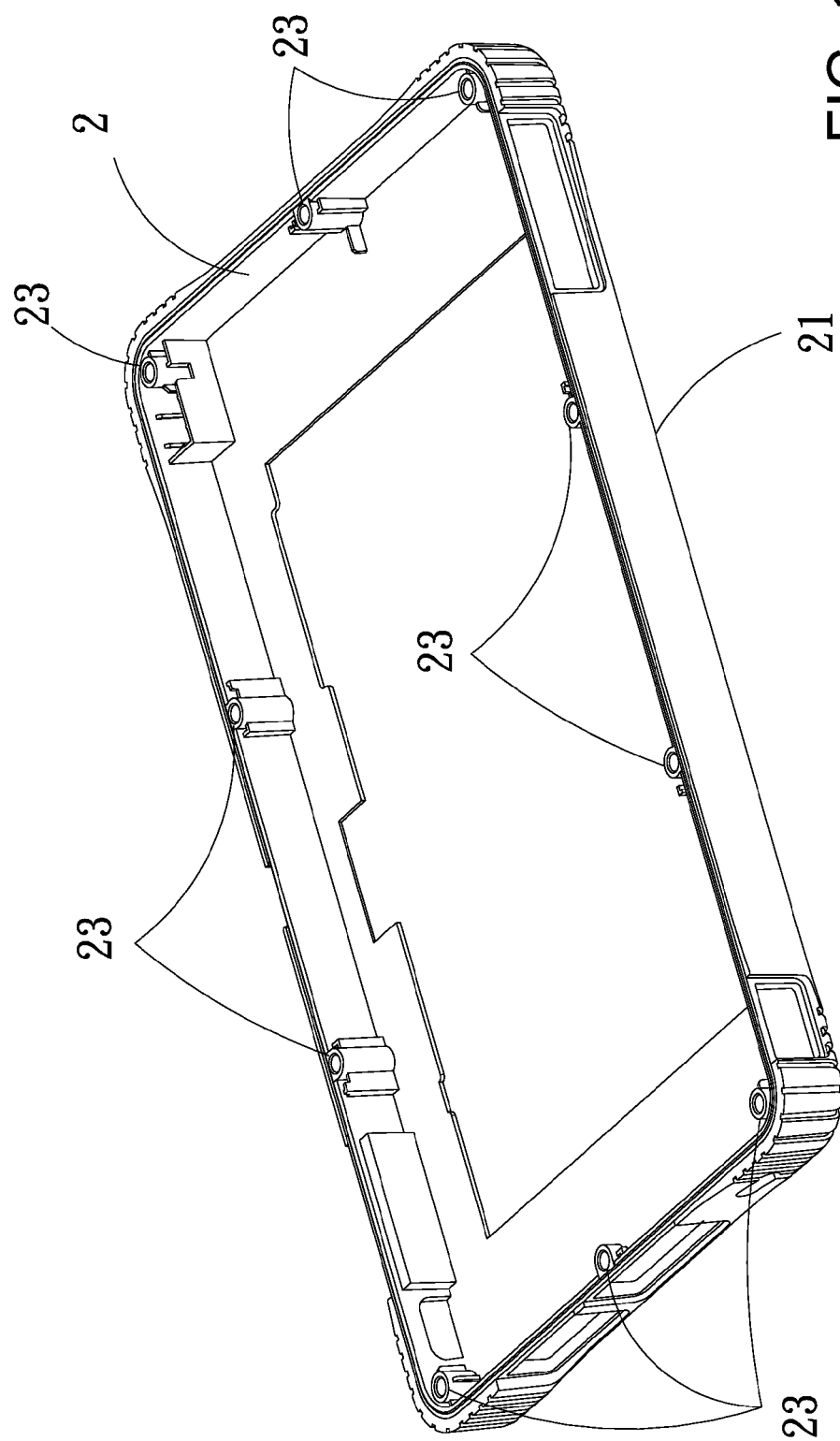
FIG. 12 is a perspective view of the assembled frame and the bumper member.
Figure 13:
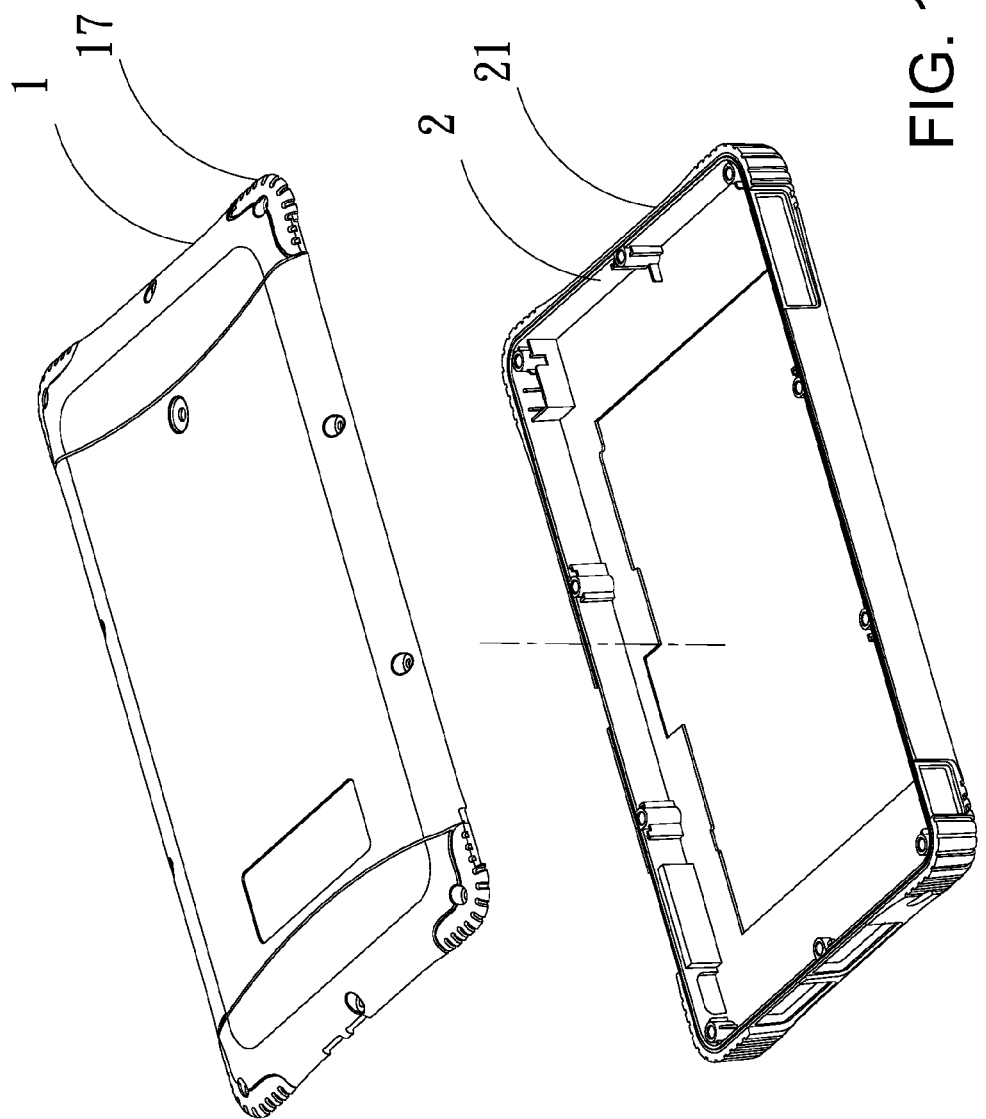
FIG. 13 is an exploded view of the assembled base and the waterproof loop member to be joined with the assembled frame and the bumper member.
Figure 14:
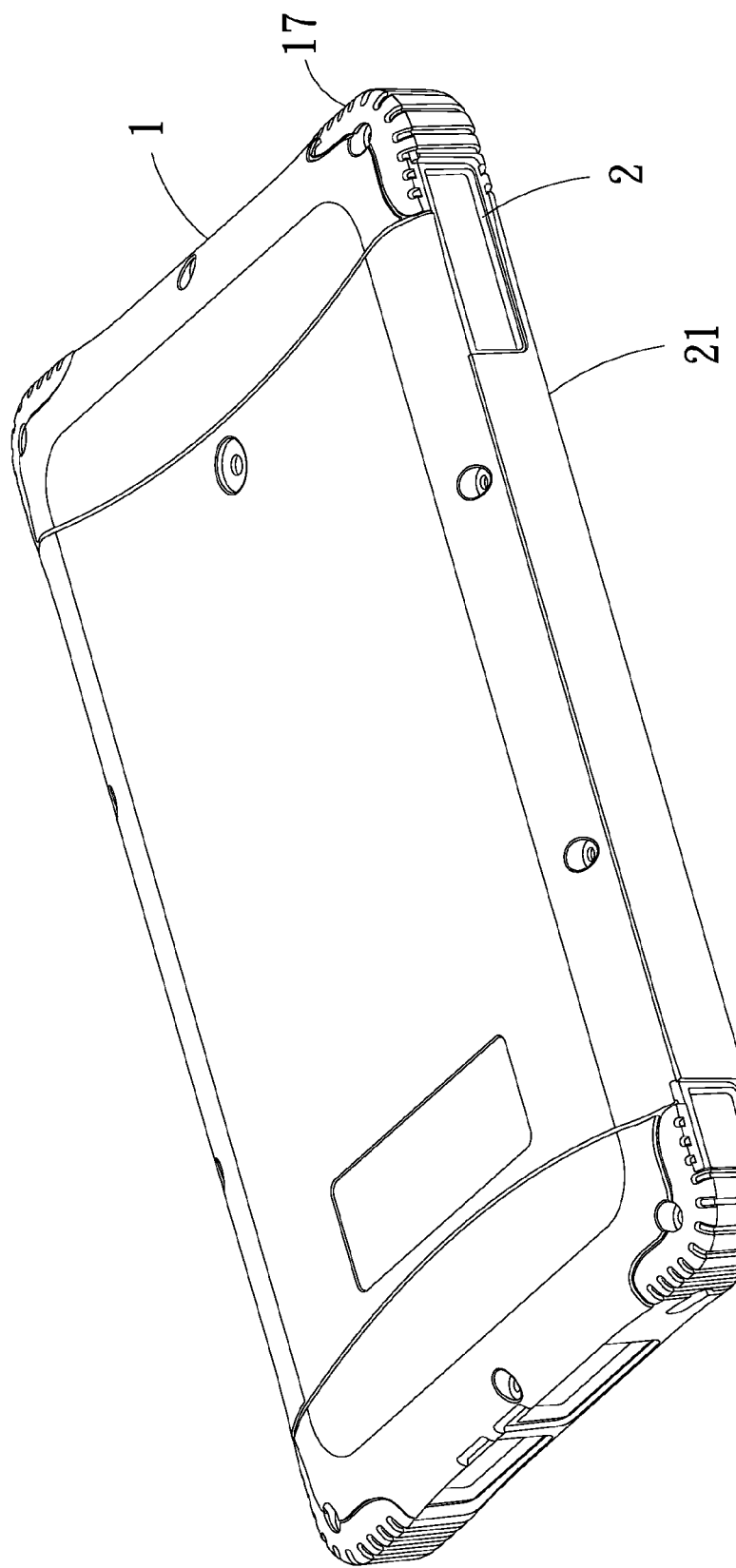
FIG. 14 is a perspective view of the assembled container.

Referring to FIGS. 1 to 14, a waterproof, shockproof container particularly for a handheld electronic device (e.g., tablet computer) in accordance with the invention comprises the following components as discussed in detail below. A base 1 is rectangular and comprises a loop flange 11 on a top surface, the loop flange 11 being along and spaced from edges, a loop gap 12 formed between the flange 11 and the edges of the base 1, four L-shaped depressions 16 on a bottom surface at four corners of the base 1 respectively, and a plurality of threaded holes 13 spaced along the gap 12 in which four of the threaded holes 14 are through the depressions 16 respectively.

A rectangular waterproof loop member comprises a plurality of bossed holes 15 spaced along edges and adapted to align with the threaded holes 13, and four L-shaped collision resistant members 17 on four corners of the waterproof loop member 14 respectively. The collision resistant members 17 are complimentary to the depressions 16.

A frame 2 is rectangular and has a substantially rectangular opening through the center. The frame 2 comprises a loop flange 23 along edges, and a plurality of bossed threaded holes 22 spaced along an inner surface of the flange 23.

A bumper member 21 is rectangular and has a substantially rectangular opening through the center. In short, both the frame 2 and the bumper member 21 are rectangular loop members.

In an assembly state, the waterproof loop member 14 is fitted in the gap 12 by snapping. The frame 2 and the bumper member 21 are joined together by snapping. A handheld electronic device (e.g., tablet computer) (not shown) then is placed in the storage space of the frame 2. The base 1 is in turn joined with the frame 2 (which has been joined with the bumper member 21) by snapping. The threaded holes 13, the bossed holes 15, and the bossed threaded holes 22 are aligned with one another. Finally, threaded fasteners (e.g., screws) can be driven through the threaded holes 13 and the bossed holes 15 into the bossed threaded holes 22 for fastening the base 1, the frame 2, and the bumper member 21 together.

It is envisaged by the invention that the handheld electronic device is waterproof. Further, collision resistance is obtained.

While the invention has been described in terms of preferred embodiments, those skilled in the art will recognize that the invention can be practiced with modifications within the spirit and scope of the appended claims.

What is claimed is:

1. A container comprising:

a rectangular base comprising a loop flange on a top, the loop flange being disposed along and spaced from edges, a loop gap formed between the flange and the edges of the base, four L-shaped depressions on a bottom at four corners of the base respectively, and a plurality of threaded holes spaced along the loop gap wherein four of the threaded holes are through the depressions respectively;

a rectangular waterproof loop member comprising a plurality of bossed holes spaced along edges, and four L-shaped collision resistant members at four corners of the waterproof loop member respectively;

a rectangular, hollow frame comprising a loop flange disposed along edges, and a plurality of bossed threaded holes spaced along an inner surface of the flange; and a rectangular, hollow bumper member;

wherein the collision resistant members are complimentary to the depressions;

wherein the waterproof loop member is fitted in the loop gap; and wherein the base, the frame, and the bumper member are releasably secured together with the threaded holes, the bossed holes, and the bossed threaded holes being aligned with one another.

* * * * *